United States Patent
Koc (10) Patent No.: US 8,008,841 B2
(45) Date of Patent: Aug. 30, 2011

(54) STATOR AND PIEZO ULTRASONIC MOTOR INCLUDING THE SAME

(75) Inventor: Burhanettin Koc, Gyunggi-do (KR)

(73) Assignee: Samsung Electro—Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/932,817

(22) Filed: Mar. 3, 2011

(65) Prior Publication Data

US 2011/0156534 A1 Jun. 30, 2011

Related U.S. Application Data

(62) Division of application No. 12/219,744, filed on Jul. 28, 2008.

(30) Foreign Application Priority Data

Jul. 27, 2007 (KR) ........................ 10-2007-0075967

(51) Int. Cl.
*H02N 2/12* (2006.01)
(52) U.S. Cl. .............................. 310/323.01; 310/323.04
(58) Field of Classification Search ............. 310/323.01–323.21, 328, 330–332, 310/365, 366
See application file for complete search history.

(56) References Cited

U.S. PATENT DOCUMENTS

| | | | |
|---|---|---|---|
| 2005/0052908 A1 | 3/2005 | Tomoeda et al. | |
| 2006/0049720 A1* | 3/2006 | Henderson et al. | 310/328 |
| 2007/0029898 A1 | 2/2007 | Lee et al. | |
| 2007/0029900 A1 | 2/2007 | Kang et al. | |
| 2007/0138915 A1 | 6/2007 | Mulvihill et al. | |
| 2008/0238254 A1 | 10/2008 | Zhou et al. | |
| 2010/0045140 A1* | 2/2010 | Kang et al. | 310/323.02 |

FOREIGN PATENT DOCUMENTS

KR 10-2006-0099261 9/2006

OTHER PUBLICATIONS

Burhanettin Koc et al., "A Piezoelectric Motor Using Two Orthogonal Bending Modes of a Hollow Cylinder", IEEE Transaction on Ultrasonics, Ferroelectrics, and Frequency Control, vol. 49, No. 4, Apr. 2002, pp. 495-500.
U.S. Appl. No. 12/219,744, filed Jul. 28, 2008, Burhanettin Koc, Samsung Electro-Mechanics Co., Ltd.
U.S. Appl. No. 12/932,820, filed Mar. 3, 2011, Burhanettin Koc, Samsung Electro-Mechanics Co., Ltd.
U.S. Patent Restriction Requirement, mailed May 25, 2010, issued in corresponding U.S. Appl. No. 12/219,744.
U.S. Patent Office Action, mailed Aug. 4, 2010, issued in corresponding U.S. Appl. No. 12/219,744.
U.S. Patent Notice of Allowance, mailed Nov. 29, 2010, issued in corresponding U.S. Appl. No. 12/219,744.
U.S. Patent Notice of Allowance mailed May 3, 2011 in co-pending U.S. Appl. No. 12/923,820.

* cited by examiner

Primary Examiner — Derek J Rosenau (57) ABSTRACT

A stator and a piezo ultrasonic motor including the same. The piezo ultrasonic motor includes a stator including an elastic body having a flat portion at its outer surface and a central hole penetrating the center of the stator with a predetermined size, and a piezoelectric body including a first internal piezoelectric body and a second internal piezoelectric body integrally disposed parallel to each other in a longitudinal direction of the flat portion and providing an external force deforming the elastic body when an AC voltage is applied, a rotor inserted in the central hole and including a contact frictionally contacting an inner surface of the central hole, an elastic part providing an elastic force maintaining close attachment of the contact to the stator. Accordingly, the manufacturing cost decreases by reducing the number of elements and simplifying a structure, and a stable driving characteristic can be achieved.

4 Claims, 8 Drawing Sheets

PRIOR ART

STATOR AND PIEZO ULTRASONIC MOTOR INCLUDING THE SAME

CROSS-REFERENCE TO RELATED APPLICATIONS

This application is a U.S. divisional application filed under 37 USC 1.53(b) claiming priority benefit of U.S. Ser. No. 12/219,744 filed in the United States on Jul. 28, 2008, which claims earlier priority benefit to Korean Patent Application No. 10-2007-75967 filed with the Korean Intellectual Property Office on Jul. 27, 2007, the disclosures of which are incorporated herein by reference.

BACKGROUND

1. Field

The present invention relates to a stator and a piezo ultrasonic motor including the same, and more particularly, to a stator and a piezo ultrasonic motor including the same, which can achieve stable driving characteristics and low manufacturing costs by reducing the number of elements and simplifying a structure.

2. Description of the Related Art

The recent rapid development of an information society has led to a demand for high-speed precision electronic and optical devices. Particularly, marketability of mobile application products for mobile phones is enhanced greatly every year to meet increasing interests of general consumers. Particularly, as pixels of a sensor increase in number, mobile phones provided with camera modules among those mobile application products are increasingly adopting digital camera functions such as automatic focusing and optical zooming, and thus competitive development thereof are being made for market occupancy.

A drive mechanism is used to drive such camera modules for mobile phones, which have high pixel resolution. Representative examples of the drive mechanism include a stepping motor, a voice coil motor, and a piezo ultrasonic motor. As for the piezo ultrasonic motor, it includes a piezoelectric body having a multilayer ceramic structure of piezoelectric ceramic sheets. The piezoelectric body causes simple vibration such as expansion and contraction when an electrical signal is applied thereto. The vibration is converted into a circular or linear movement by fractional contact between a stator and a rotor, so that the piezo ultrasonic motor can perform a motor function of generating a rotation force. As compared to an electromagnetic motor, the piezo ultrasonic motor has higher energy density, faster response time, and higher position accuracy. The piezo ultrasonic motor also has an off-power holding function, does not cause noise during operation, and is not affected by electromagnetic waves.

Figure 1A:
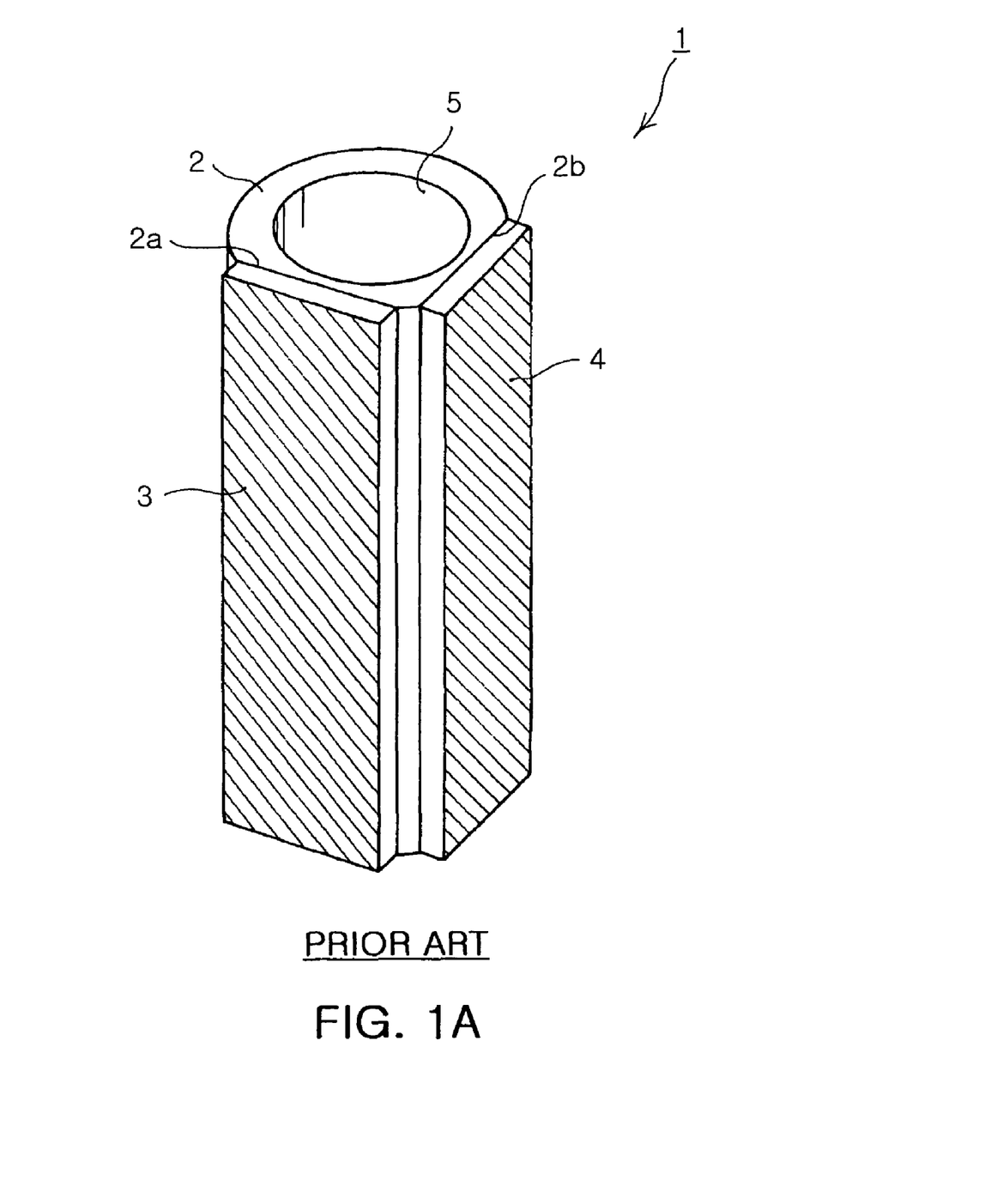
FIG. 1A is a perspective view of a related art stator.
Figure 1B:
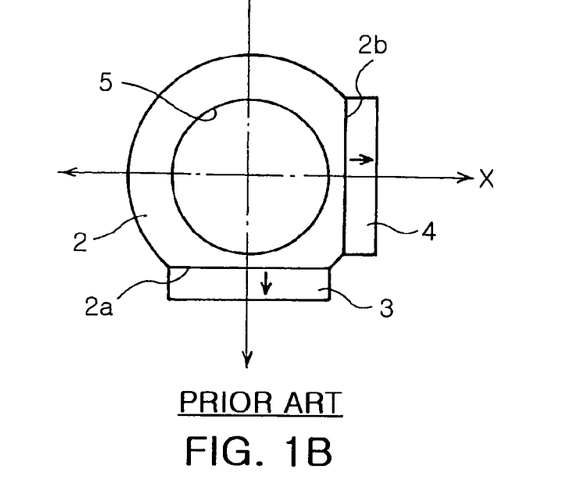
FIG. 1B is a plan view of the related art stator.

FIG. 1A is a perspective view of a related art stator, and FIG. 1B is a plan view of the related art stator. Referring to FIGS. 1A and 1B, a related art stator 1 includes a hollow cylindrical elastic body 2 formed of a ceramic material or a metal material, and plate-shaped first and second piezoelectric bodies 3 and 4 longitudinally provided on a first flat portion 2a and a second flat portion 2b of an outer surface of the elastic body 2, which have a phase difference of 90 degrees therebetween.

When an AC voltage, i.e., an electrical signal, is applied to the first and second piezoelectric bodies 3 and 4 through an external electrode (not shown) formed thereon, the first and second piezoelectric bodies 3 and 4 contract or expand in a longitudinal direction, thereby causing the elastic body 2 having a fixed length to relatively bend perpendicularly to the longitudinal direction. Thus, in the case of a bottom end of the elastic body 2 is fixed, a top end, which is free end, is displaced in a y-direction by the first piezoelectric body 3 and in an x-direction by the second piezoelectric body 4.

In this case, as AC voltages having different phases are respectively applied to the first and second piezoelectric bodies 3 and 4 as electrical signals, the top end of the elastic body 2 bends in the x-direction and in the y-direction, varying in its bending degree according to the AC voltage strength. Accordingly, a rotor (not shown) disposed in a central hole 5 of the elastic body 2 is rotated by contact between the rotor and the stator 2.

However, since the related art stator 1 needs to be manufactured through a high precision process, the manufacturing cost of the related art piezo ultrasonic motor increases. In detail, the first and second flat portions 2a and 2b on which the first and second dielectric bodies 3 and 4 are respectively mounted must be precisely formed so as to have a phase difference of 90 degrees therebetween. Then, the first and second piezoelectric bodies 3 and 4 must be precisely bonded on the first and second flat portions 2a and 2b. Thus, the manufacturing costs increase because of high precision processes required for the precise processing of the first and second flat portions 2a and 2b at the outer surface of the elastic body 2, and the precise bonding of the first and second piezoelectric bodies 3 and 4.

Also, a number of elements are used to constitute the stator 1, and thus the manufacturing cost of the piezo ultrasonic motors also increases.

SUMMARY

An aspect of the present invention provides a stator and a piezo ultrasonic motor including the same, which can lower a manufacturing cost by reducing the number of elements and simplifying a structure thereof, and can achieve a stable driving characteristic.

According to an aspect of the present invention, there is provided a stator including: an elastic body including a flat portion longitudinally disposed at an outer surface thereof, and a central hole penetrating a central portion of the elastic body and having a predetermined size; and a piezoelectric body integrally mounted on the flat portion and providing an external force for deforming the elastic body by generating a vibration mode in an x-direction and a vibration mode in a y-direction at the same time when an AC voltage is applied thereto. The piezoelectric body includes a first internal piezoelectric body and a second internal piezoelectric body that are integrally disposed parallel to each other in a longitudinal direction of the flat portion.

The piezoelectric body may be a multilayer ceramic structure in which first and second ceramic sheets are alternately stacked parallel to the flat portion. The first internal piezoelectric body may include a first internal electrode provided on the first ceramic sheet by pattern printing and electrically connected to a first external electrode provided on an outer surface of the piezoelectric body. The second internal piezoelectric body may include a second internal electrode provided parallel to the first internal electrode on the first ceramic sheet by pattern printing and electrically connected to a second external electrode provided on the outer surface of the piezoelectric body. The first internal piezoelectric body and the second internal piezoelectric body may be polarized in a direction of a thickness of the piezoelectric body. An internal ground electrode may be provided on the second ceramic sheet by pattern printing and electrically connected to an external ground electrode provided on the outer surface of the piezoelectric body.

The piezoelectric body may be a multilayer ceramic structure in which first and second ceramic sheets are alternately stacked parallel to the flat portion. The first internal piezoelectric body may include a first internal electrode provided on the first ceramic sheet by pattern printing and electrically connected to a first external electrode provided on an outer surface of the piezoelectric body. The second internal piezoelectric body may include a second internal electrode provided parallel to the first internal electrode on the first ceramic sheet by pattern printing and electrically connected to a second external electrode provided on the outer surface of the piezoelectric body. The first internal piezoelectric body and the second internal piezoelectric body may be polarized in a direction of a width of the piezoelectric body. An internal ground electrode may be provided on the second ceramic sheet by pattern printing and electrically connected to an external ground electrode provided on the outer surface of the piezoelectric body.

The piezoelectric body may be a multilayer ceramic structure in which first, second and third ceramic sheets are stacked perpendicularly to the flat portion. The first internal piezoelectric body may include a first internal electrode provided on the first ceramic sheet by pattern printing and electrically connected to a first external electrode provided on an outer surface of the piezoelectric body. The second internal piezoelectric body may include a second internal electrode provided on the second ceramic sheet by pattern printing and electrically connected to a second external electrode provided on the outer surface of the piezoelectric body. The first internal piezoelectric body and the second internal piezoelectric body may be polarized in a direction of a thickness of the piezoelectric body. An internal ground electrode may be provided on the third ceramic sheet by pattern printing and electrically connected to an external ground electrode provided on the outer surface of the piezoelectric body.

The piezoelectric body may be shorter in length than the elastic body.

According to another aspect of the present invention, there is provided a piezo ultrasonic motor including: a stator including an elastic body including a flat portion at an outer surface thereof and a central hole penetrating a central portion of the stator and having a predetermined size, and a piezoelectric body providing an external force for deforming the elastic body when an AC voltage is applied thereto and including a first internal piezoelectric body and a second internal piezoelectric body integrally disposed parallel to each other in a longitudinal direction of the flat portion; a rotor inserted in the central hole and including a contact frictionally contacting an inner surface of the central hole; and an elastic part providing an elastic force maintaining close attachment of the contact to the stator.

The contact may include: a movable contact movably assembled to the rotor; and a fixed contact fixed to an end portion of the rotor.

The movable contact and the fixed contact may include inclined contact surfaces that surface-contact inclined surfaces formed at one end and the other end of the central hole, respectively.

The elastic part may include a spring member disposed between the movable contact and a stopper fixed at a front end of the rotor.

The piezoelectric body may be a multilayer ceramic structure in which first and second ceramic sheets are alternately stacked parallel to the flat portion. The first internal piezoelectric body may include a first internal electrode provided on the first ceramic sheet by pattern printing and electrically connected to a first external electrode provided on an outer surface of the piezoelectric body. The second internal piezoelectric body may include a second internal electrode provided parallel to the first internal electrode on the first ceramic sheet by pattern printing and electrically connected to a second external electrode provided on the outer surface of the piezoelectric body. The first internal piezoelectric body and the second internal piezoelectric body may be polarized in a direction of a thickness of the piezoelectric body. An internal ground electrode may be provided on the second ceramic sheet by pattern printing and is electrically connected to an external ground electrode provided on the outer surface of the piezoelectric body.

The piezoelectric body may be a multilayer ceramic structure in which first and second ceramic sheets are alternately stacked parallel to the flat portion. The first internal piezoelectric body may include a first internal electrode provided on the first ceramic sheet by pattern printing and electrically connected to a first external electrode provided on an outer surface of the piezoelectric body. The second internal piezoelectric body may include a second internal electrode provided parallel to the first internal electrode on the first ceramic sheet by pattern printing and electrically connected to a second external electrode provided on the outer surface of the piezoelectric body. The first internal piezoelectric body and the second internal piezoelectric body may be polarized in a direction of a width of the piezoelectric body. An internal ground electrode may be provided on the second ceramic sheet by pattern printing and electrically connected to an external ground electrode provided on the outer surface of the piezoelectric body.

The piezoelectric body may be a multilayer ceramic structure in which first, second and third ceramic sheets are stacked perpendicularly to the flat portion. The first internal piezoelectric body may include a first internal electrode provided on the first ceramic sheet by pattern printing and electrically connected to a first external electrode provided on an outer surface of the piezoelectric body. The second internal piezoelectric body may include a second internal electrode provided on the second ceramic sheet by pattern printing and electrically connected to a second external electrode provided on the outer surface of the piezoelectric body. The first internal piezoelectric body and the second internal piezoelectric body may be polarized in a direction of a thickness of the piezoelectric body. An internal ground electrode is provided on the third ceramic sheet by pattern printing and is electrically connected to an external ground electrode provided on the outer surface of the piezoelectric body.

The piezoelectric body may be shorter in length than the elastic body.

BRIEF DESCRIPTION OF THE DRAWINGS

The above and other aspects, features and other advantages of the present invention will be more clearly understood from the following detailed description taken in conjunction with the accompanying drawings, in which.

DESCRIPTION OF EMBODIMENTS

Exemplary embodiments of the present invention will now be described in detail with reference to the accompanying drawings.

Figure 2:
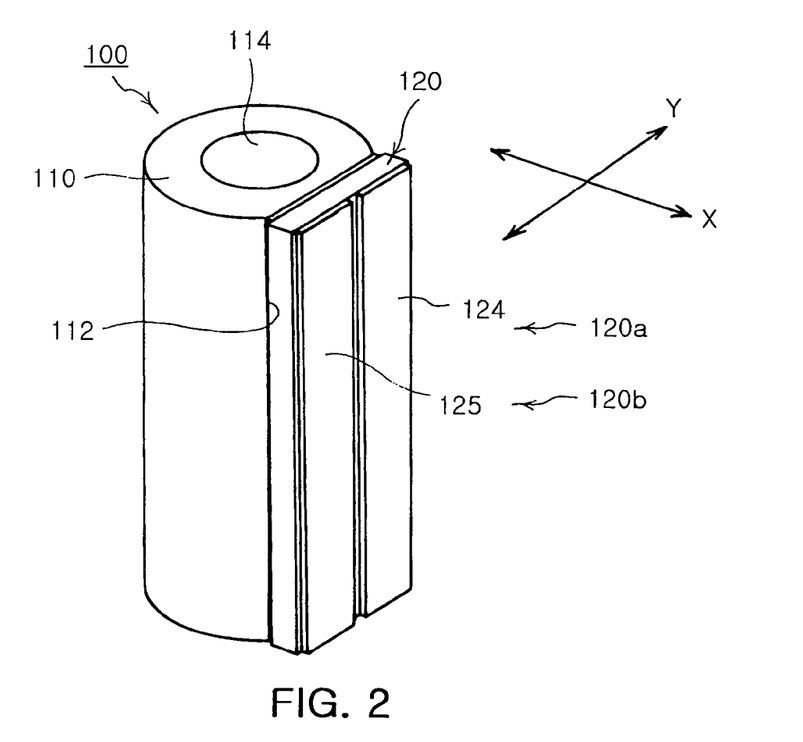
FIG. 2 is a perspective view of a stator according to an exemplary embodiment of the present invention.
Figure 3A:
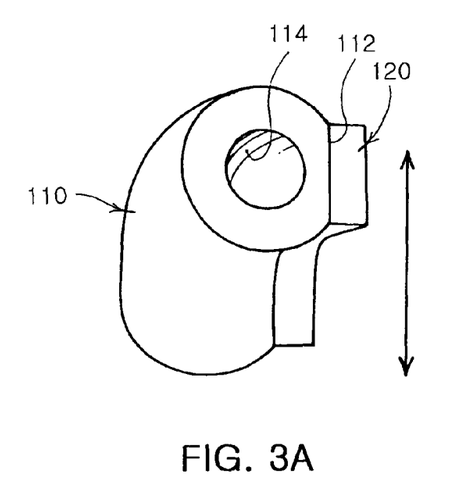
FIG. 3A is a view illustrating the operation in which an elastic body of the stator of FIG. 2 deforms in a y-direction.
Figure 3B:
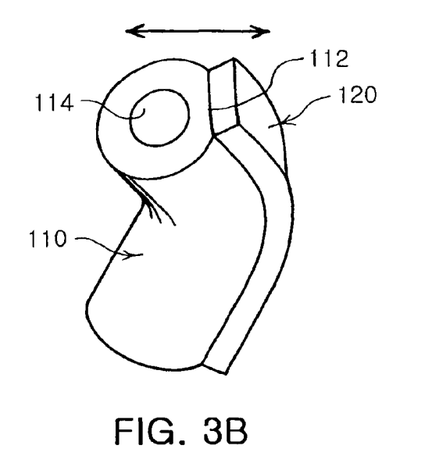
FIG. 3B is a view illustrating the operation in which the elastic body of the stator of FIG. 2 deforms in an x-direction.
Figure 4:
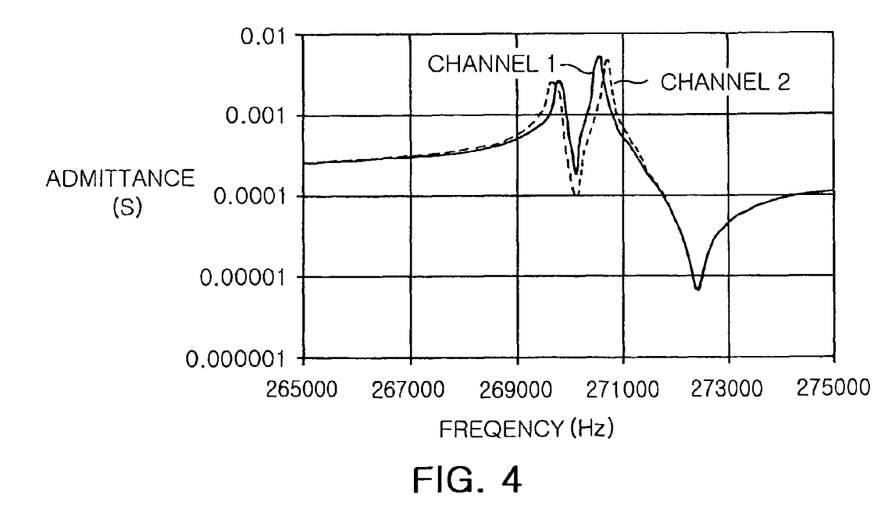
FIG. 4 is a graph showing admittance with respect to a frequency of a piezoelectric body of the stator of FIG. 2.

FIG. 2 is a perspective view of a stator according to an exemplary embodiment of the present invention. FIGS. 3A and 3B are views illustrating the operation of the stator of FIG. 2. FIG. 3A illustrates deformation of an elastic body in a y-direction, and FIG. 3B illustrates deformation of the elastic body in an x-direction. FIG. 4 is a graph showing admittance with respect to the frequency of a piezoelectric body used in the stator of FIG. 2.

As shown in FIGS. 2 and 3, a stator 100 according to the exemplary embodiment of the present invention includes an elastic body 110 and a piezoelectric body 120.

The elastic body 110 is an elastic member that has a flat portion 112 at its outer surface in a longitudinal direction of the elastic body 110. The flat portion 112 is a flattened surface formed by flattening a portion of the outer surface of the elastic body 110.

The elastic body 110 may be formed of a ceramic material such as alumina or zirconia, or a metal material such as stainless steel or brass.

The elastic body 110 has a central hole 114 of a predetermined size substantially at the center of the elastic body 110. The central hole 114 may be disposed parallel to the flat portion 112.

According to the exemplary embodiment of FIG. 2, the elastic body 110 is a hollow cylindrical body having the central hole 114 at its center portion. However, the present invention is not limited thereto, and the elastic body 110 may be a hollow rectangular body or a hollow polygonal body.

Also, when an AC voltage is applied, the piezoelectric body 120 causes a vibration mode in the x-direction and a vibration mode in the y-direction at the same time, thereby providing an external force to deform the elastic body 110.

The piezoelectric body 120 is attached onto the flat portion 112 of the elastic body 110 by a bonding agent applied on the flat portion 112. Thus, the piezoelectric body 120 is integrally mounted onto the elastic body 110.

If the elastic body 110 is formed of a conductive metal material, an insulating layer may be provided on the flat portion 112 or on a surface of the piezoelectric body 120 which is attached to the flat portion 112.

The piezoelectric body 120 provided on the flat portion 112 includes a first internal piezoelectric body 120a and a second internal piezoelectric body 120b that are integrally disposed parallel to each other in a longitudinal direction of the flat portion 110.

Figure 6A:
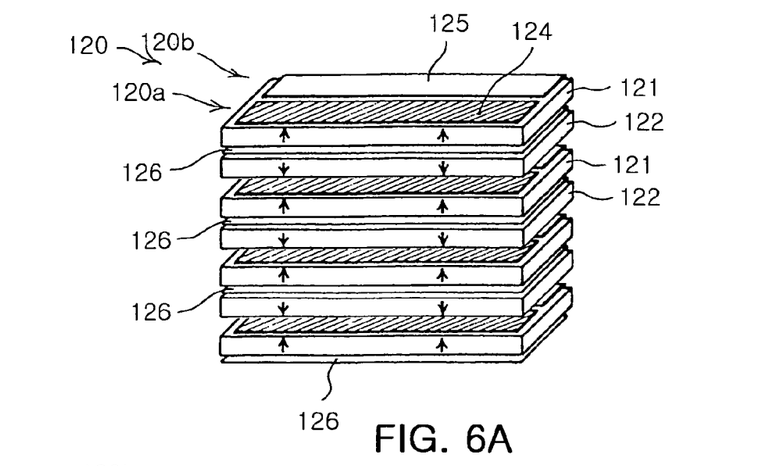
FIG. 6A is an exploded perspective view of a piezoelectric body of a stator, according to an exemplary embodiment of the present invention.
Figure 6B:
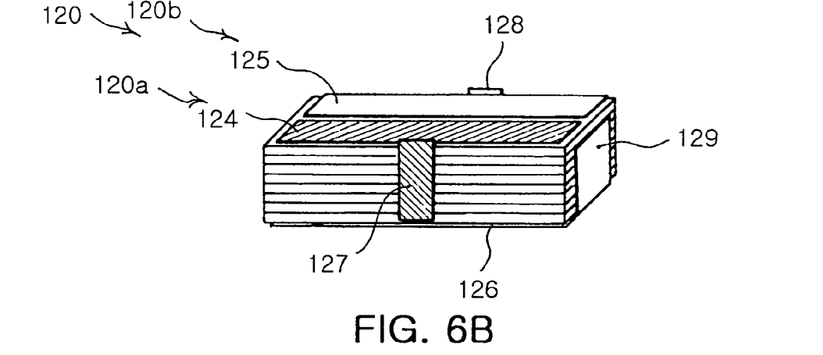
FIG. 6B is a perspective view of an exterior of the piezoelectric body of FIG. 6A.
Figure 6C:
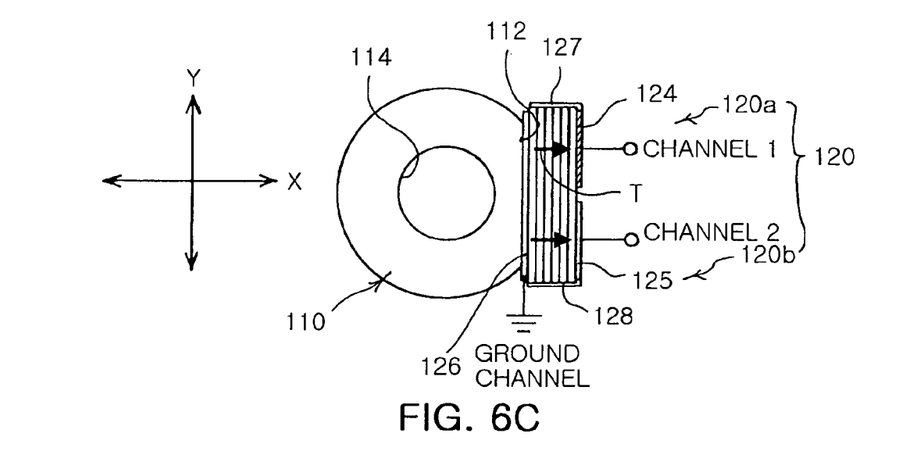
FIG. 6C is a plan view of the piezoelectric body of FIG. 6A mounted to an elastic body.
Figure 7A:
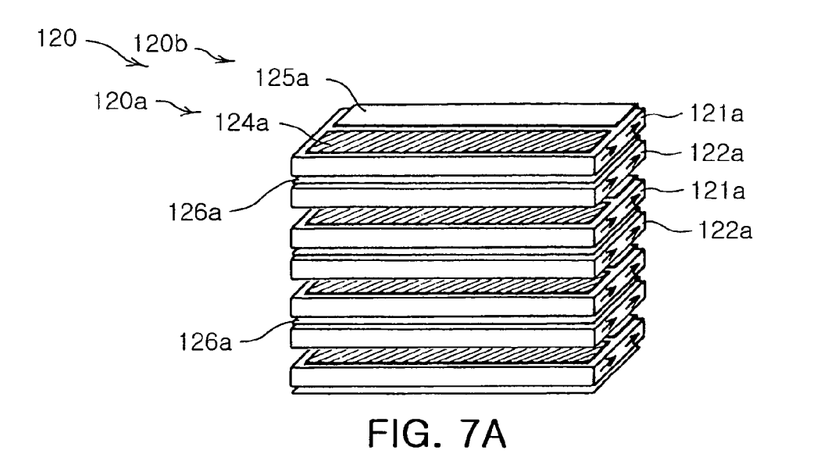
FIG. 7A is an exploded perspective view of a piezoelectric body of a stator, according to another exemplary embodiment of the present invention.
Figure 7B:
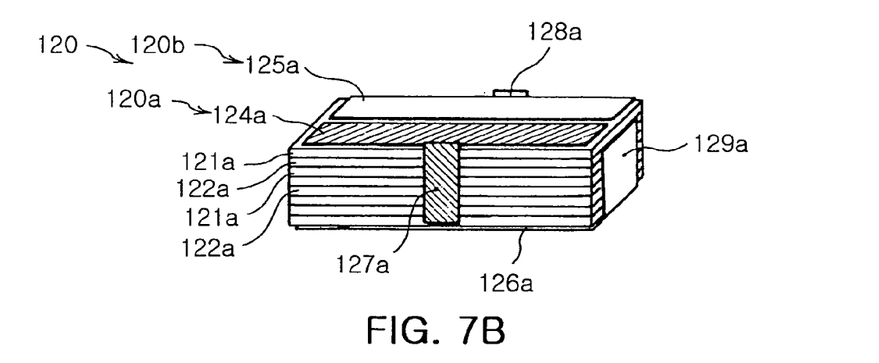
FIG. 7B is a perspective view of an exterior of the piezoelectric body of FIG. 7A.
Figure 7C:
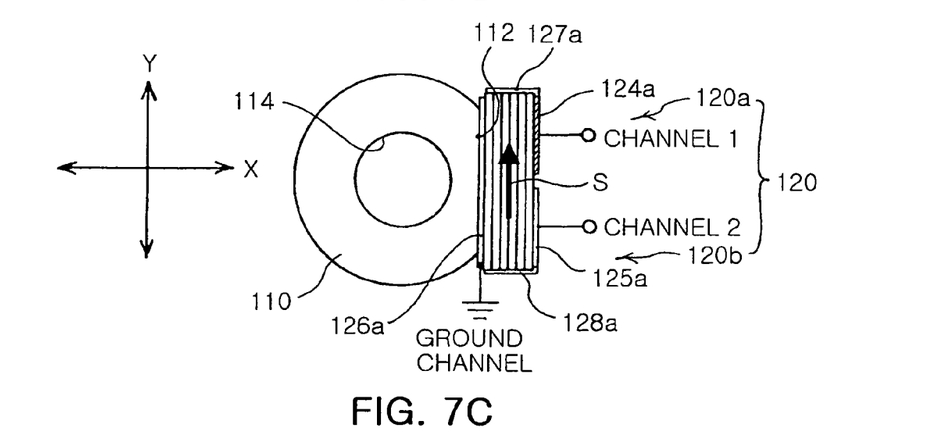
FIG. 7C is a plan view of the piezoelectric body of FIG. 7A mounted to an elastic body.

The piezoelectric body 120 including the first and second internal piezoelectric bodies 120a and 120b which are integrally disposed parallel to each other may have a multilayer ceramic structure of, e.g., first and second ceramic sheets 121 and 122 of FIGS. 6A, 6B and 6C or first and second ceramic sheets 121a and 122a of FIGS. 7A, 7B and 7C, which are stacked parallel to the flat portion 112. Alternatively, the piezoelectric body 120 may have a multilayer ceramic structure of, e.g., first, second and third ceramic sheets 121b, 122b and 123b stacked orthogonally to the flat portion 112.

Referring to FIGS. 6A, 6B and 6C, the piezoelectric body 120 has a multilayer ceramic structure in which the first and second ceramic sheets 121 and 122 are alternately stacked parallel to the flat portion 112 of the elastic body 110.

The first internal piezoelectric body 120a includes a first internal electrode 124 provided on a top surface of the first ceramic sheet 121 by pattern printing. The first internal electrode 12 has a portion extending up to an outer edge of the first ceramic sheet 121 so as to be electrically connected to a first external electrode 124 provided on a first outer side surface of the piezoelectric body 120. The second internal piezoelectric body 120b includes a second internal electrode 125 provided parallel to the first internal electrode 124 on the top surface of the first ceramic sheet 121 by pattern printing. The second internal electrode 125 has a portion extending up to an outer edge of the first ceramic sheet 121 so as to be electrically connected to a second external electrode 128 provided on a second outer side surface of the piezoelectric body 120. The first internal piezoelectric body 120a and the second internal piezoelectric body 120b are polarized in a direction of a thickness T of the piezoelectric body 120.

An internal ground electrode 126 is provided on the second ceramic sheet 122 by pattern printing. The internal ground electrode 126 has a portion extending up to an outer edge of the ceramic sheet 122 so as to be electrically connected to an external ground electrode 129 provided on a third outer side surface of the piezoelectric body 120.

The first internal electrode 124 or the first external electrode 127 is electrically connected to a channel 1 in order to apply an AC voltage from the outside to the first internal piezoelectric body 120a. The second internal electrode 125 or the second external electrode 128 is electrically connected to a channel 2 in order to apply an AC voltage from the outside to the second internal piezoelectric body 120b. The internal ground electrode 126 or the external ground electrode 129 is electrically connected to a ground channel.

Referring to FIGS. 7A, 7B and 7C, the first internal piezoelectric body 120a of the piezoelectric body 120 includes a first internal electrode 124a provided on a top surface of the first ceramic sheet 121a by pattern printing and electrically connected to a first external electrode 127a provided on a first outer side surface of the piezoelectric body 120. The second internal piezoelectric body 120b includes a second internal electrode 125a provided parallel to the first internal electrode 124a on the top surface of the first ceramic sheet 121a by pattern printing and electrically connected to a second external electrode 128a provided on a second outer side surface of the piezoelectric body 120. The first internal piezoelectric body 120a and the second internal piezoelectric body 120b are polarized in a direction of a width S of the piezoelectric body 120.

An internal ground electrode 126a is provided on the second ceramic sheet 122a by pattern printing to be electrically connected to an external ground electrode 129a provided on a third outer side surface of the piezoelectric body 120.

The first internal electrode 124a or the first external electrode 127a is electrically connected to a channel 1 in order to apply an AC voltage from the outside to the first internal piezoelectric body 120a. The second internal electrode 125a or the second external electrode 128a is electrically connected to a channel 2 in order to apply an AC voltage from the outside to the second internal piezoelectric body 120b. The internal ground electrode 126a or the external ground electrode 129a is electrically connected to a ground channel.

Figure 8A:
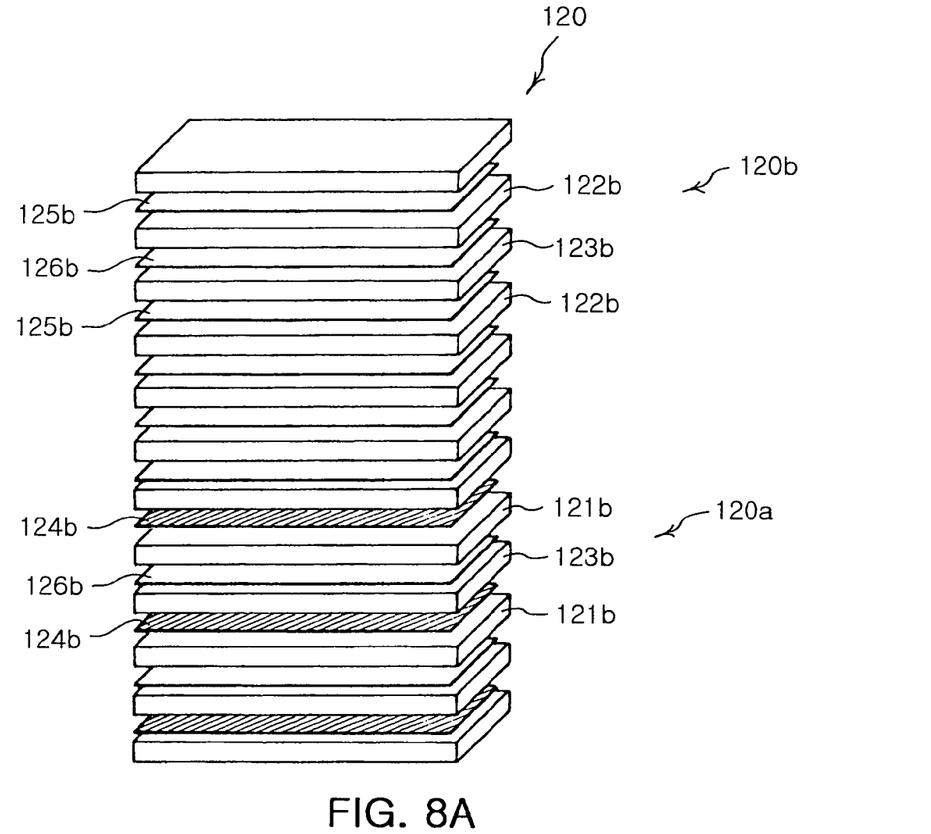
FIG. 8A is an exploded perspective view of a piezoelectric body of a stator, according to still another exemplary embodiment of the present invention.
Figure 8B:
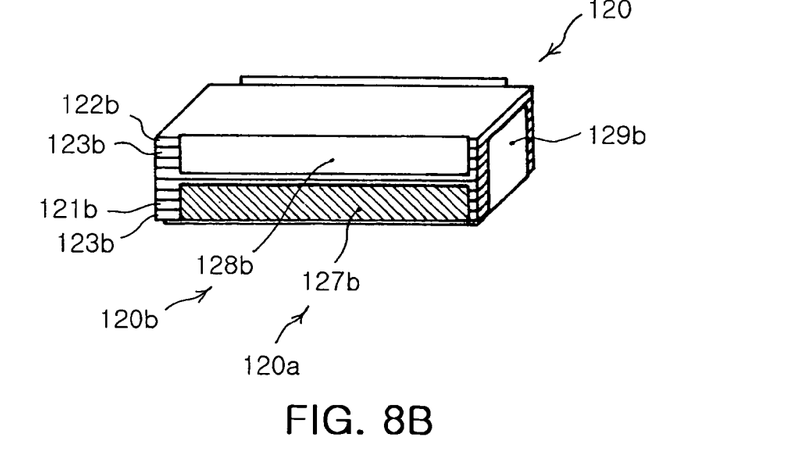
FIG. 8B is a perspective view of an exterior of the piezoelectric body of FIG. 8A.
Figure 8C:
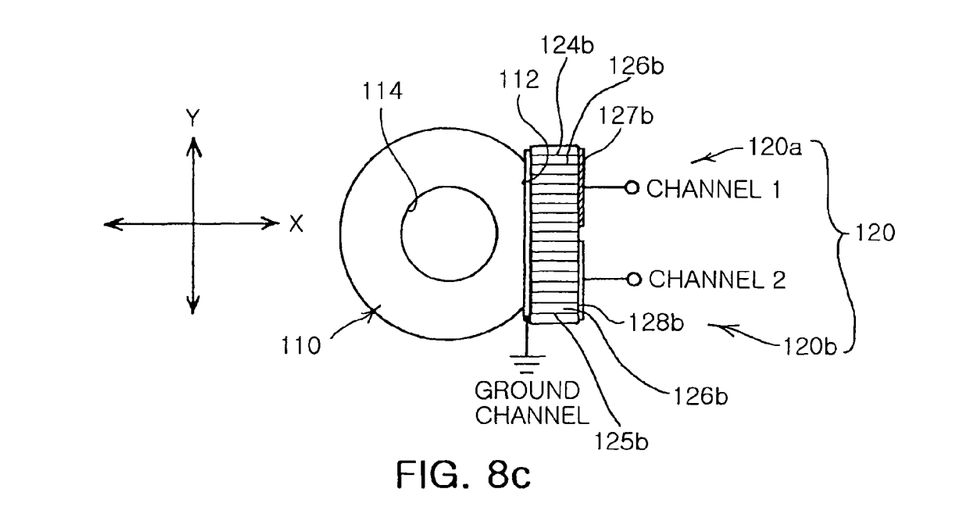
FIG. 8C is a plan view of the piezoelectric body of FIG. 8A mounted to an elastic body.

Referring to FIGS. 8A, 8B and 8C, the piezoelectric body 120 has a multilayer ceramic structure in which the first and third ceramic sheets 121b and 123b are alternately disposed perpendicularly to the flat portion 112, and the second and third ceramic sheets 122b and 123b are also alternately disposed perpendicularly to the flat portion 112.

The first internal piezoelectric body 120a includes a first internal electrode 124b provided on a top surface of the first ceramic sheet 121b by pattern printing. The first internal electrode 124b has a portion extending up to an outer edge of the first ceramic sheet 121b so as to be electrically connected to a first external electrode 127b provided on a first outer side surface of the piezoelectric body 120. The second internal piezoelectric body 120b includes a second internal electrode 125b provided on the top surface of the second ceramic sheet 122b by pattern printing. The second internal electrode 125b has a portion extending up to an outer edge of the second ceramic sheet 122b so as to be electrically connected to a second external electrode 128b provided on a second outer side surface of the piezoelectric body 120. The first internal piezoelectric body 120a and the second internal piezoelectric body 120b are polarized in a direction of a thickness of the piezoelectric body 120.

An internal ground electrode 126b is provided on the third ceramic sheet 123b by pattern printing and has a portion extending up to an outer edge of the third ceramic sheet 123b to be electrically connected to an external ground electrode 129b provided on a third outer side surface of the piezoelectric body 120.

The first internal electrode 124b or the first external electrode 127b is electrically connected to a channel 1 in order to apply an AC voltage from the outside to the first internal piezoelectric body 120a. The second internal electrode 125b or the second external electrode 128b is electrically connected to a channel 2 in order to apply an AC voltage from the outside to the second internal piezoelectric body 120b. The internal ground electrode 126b or the external ground electrode 129b is electrically connected to a ground channel.

As shown in FIG. 4, a vibration peak of the piezoelectric body 120 having the aforementioned structure is approximately 269500 Hz in the vibration mode in the y-direction, and a vibration peak thereof is approximately 270500 Hz in the vibration mode in the x-direction. Thus, if a resonant frequency of approximately 207000 Hz is applied to the channel 1 or channel 2, the vibrations in both x and y directions, as shown in FIGS. 3A and 3B, occur simultaneously.

If an AC voltage is applied to the channel 1 and the channel 2 is opened, a wobble motion is generated in one direction. This is because deformation of the first internal piezoelectric body 120a deforms the piezoelectric body 120 in the y-direction and in the x-direction at the same time.

In contrast, if an AC voltage is applied to the channel 2 and the channel 1 is opened, a wobble motion is generated in a direction opposite to the one direction. This is because deformation of the second internal piezoelectric body 120b deforms the piezoelectric body 120 in the y-direction and deformation in the x-direction at the same time.

Figure 5:
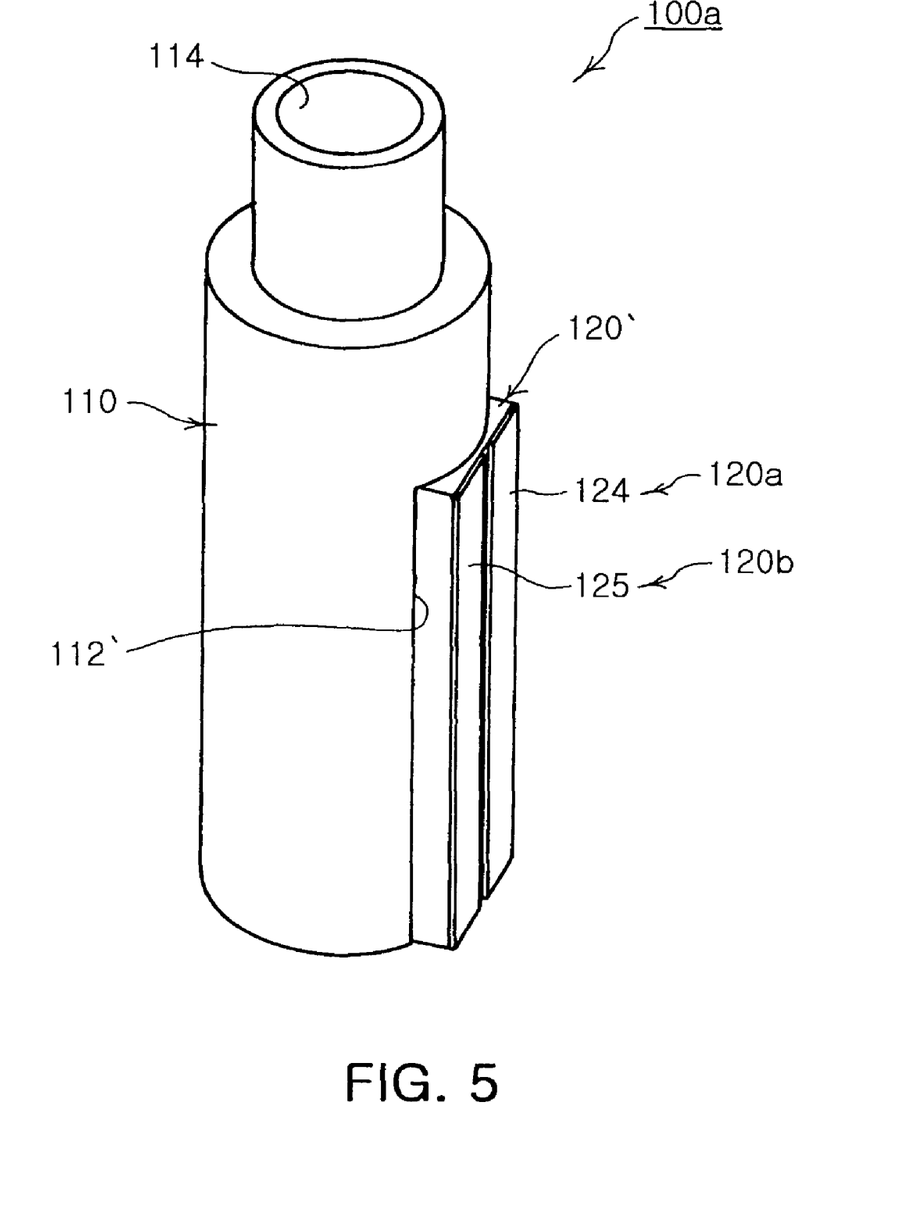
FIG. 5 is a perspective view of a stator according to another exemplary embodiment of the present invention.

FIG. 5 is a perspective view of a stator according to another exemplary embodiment of the present invention. A stator 100a according to the embodiment of FIG. 5 includes a piezoelectric body 120' provided on a flat portion 112' disposed at an outer surface of the elastic body 110. The piezoelectric body 120' is shorter in length than the elastic body 110, so that a relatively small external force can be generated as compared to the piezoelectric body 120 of FIG. 2 having the same length as that of the elastic body 110.

Figure 9:
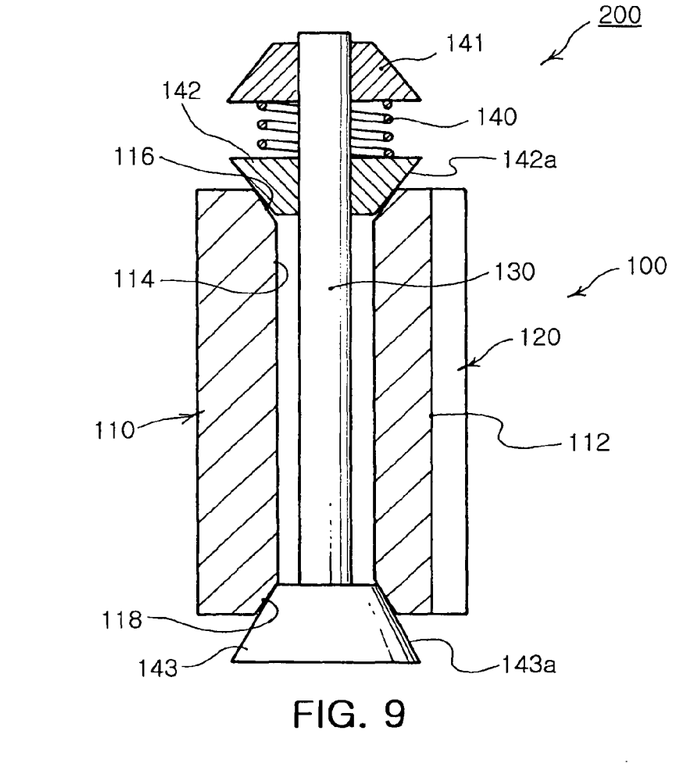
FIG. 9 is a view illustrating a piezo ultrasonic motor according to an exemplary embodiment of the present invention.

FIG. 9 illustrates a piezo ultrasonic motor according to an exemplary embodiment of the present invention. A piezo ultrasonic motor 200 according to the embodiment of FIG. 9 includes the stator 100, a rotor 130 and an elastic part 140.

The stator 100 includes the elastic body 110 and the piezoelectric body 120. The elastic body 110 is an elastic member having the flat portion 112 at its outer surface and the central hole 114 penetrating substantially the center of the elastic body 110 and having a predetermined size.

The piezoelectric body 120 includes the first internal piezoelectric body 120a and the second internal piezoelectric body 120b, which are integrally provided. The first internal piezoelectric body 120a and the second internal piezoelectric body 120b are disposed parallel to each other in a longitudinal direction of the flat portion 112. Thus, when an AC voltage is applied through the channel 1 or channel 2, the piezoelectric body 120 provides an external force for deforming the elastic body 110.

The rotor 130 is inserted in the central hole 114 and includes a contact that frictionally contacts an inner surface of the central hole 114.

The rotor 130 may be a shaft member, which have a smaller outer diameter than an inner diameter of the central hole 114, and a longer length than that of the elastic body 110.

The contact includes a movable contact 142 movably assembled at a front end of the rotor 130, and a fixed contact 143 fixed to a rear end of the rotor 130. The movable contact 142 has therein a through hole in which the rotor 130 is penetratingly inserted.

The movable contact 142 has a contact surface 142a around its outer surface. The contact surface 142a is inclined at a predetermined angle so as to surface-contact an inclined surface 116 disposed around an upper end of the central hole 114. The fixed contact 143 also includes a contact surface 143a around its outer surface. The contact surface 143a is inclined at a predetermined angle so as to surface-contact an inclined surface 118 disposed around a lower end of the central hole 114.

The elastic part 140 provides an elastic force of predetermined strength so as to maintain close attachment of the movable contact 142 and the fixed contact 143 to elastic body 110 of the stator 100.

The elastic part 140 is provided as a spring member disposed between the movable contact 142 and a stopper 141 mounted at a front end of the rotor 130.

In FIG. 9, a coil spring is illustrated as the elastic part 140. However, the present invention is not limited thereto, and the elastic part 140 may be provided as a leaf spring disposed between the stopper 141 and the contact.

Accordingly, when an AC voltage is applied to a first channel or a second channel of the piezoelectric body 120 of the stator 100, the piezoelectric body 120 generates a vibration mode in the x-direction and a vibration mode in the y-direction at the same time in a state where a lower end of the elastic body 110 is fixed. Thus, an upper end of the elastic body 110 rotates clockwise or counterclockwise around the center of the central hole 114.

Subsequently, the rotor 130 is rotated clockwise or counterclockwise by fractional contact between the central hole 114 and the contact. This is because the contact of the rotor 130 inserted in the central hole 114 includes the movable contact 142 and the fixed contact 143 surface-contacting the inclined surfaces 116 and 118 provided around both ends of the central hole 114, respectively.

According to the embodiments of the present invention, the piezoelectric body includes a pair of integrally provided first and second internal piezoelectric bodies at a flat portion of an outer surface of the elastic body. Thus, when an AC voltage is applied, the piezoelectric body provides an external force for generating a wobble motion of the elastic body. Accordingly, a manufacturing cost can be reduced by reducing the number of elements and simplifying a structure. Also, a stable driving characteristic can be achieved because the rotor can be rotated by a fractional force between the stator and the rotor disposed in the central hole of the elastic body.

While the present invention has been shown and described in connection with the exemplary embodiments, it will be apparent to those skilled in the art that modifications and variations can be made without departing from the spirit and scope of the invention as defined by the appended claims.

What is claimed is:

1. A stator comprising:
an elastic body including a flat portion longitudinally disposed at an outer surface thereof, and a central hole penetrating a central portion of the elastic body and having a predetermined size; and
a piezoelectric body integrally mounted on the flat portion and providing an external force for deforming the elastic body by generating a vibration mode in an x-direction and a vibration mode in a y-direction at the same time when an AC voltage is applied thereto, the piezoelectric body including a first internal piezoelectric body and a second internal piezoelectric body that are integrally disposed parallel to each other in a longitudinal direction of the flat portion, wherein
the piezoelectric body is a multilayer ceramic structure in which first, second and third ceramic sheets are stacked perpendicularly to the flat portion,
the first internal piezoelectric body includes a first internal electrode provided on the first ceramic sheet by pattern printing and electrically connected to a first external electrode provided on an outer surface of the piezoelectric body, and the second internal piezoelectric body includes a second internal electrode provided on the second ceramic sheet by pattern printing and electrically connected to a second external electrode provided on the outer surface of the piezoelectric body, wherein the first internal piezoelectric body and the second internal piezoelectric body are polarized in a direction of a thickness of the piezoelectric body, and
an internal ground electrode is provided on the third ceramic sheet by pattern printing and is electrically connected to an external ground electrode provided on the outer surface of the piezoelectric body.

2. The stator of claim 1, wherein the piezoelectric body is shorter in length than the elastic body.

3. A piezo ultrasonic motor comprising:
a stator comprising an elastic body including a flat portion at an outer surface thereof and a central hole penetrating a central portion of the stator and having a predetermined size, and a piezoelectric body including a first internal piezoelectric body and a second internal piezoelectric body integrally disposed parallel to each other in a longitudinal direction of the flat portion, and providing an external force for deforming the elastic body when an AC voltage is applied thereto;
a rotor inserted in the central hole and comprising a contact frictionally contacting an inner surface of the central hole; and
an elastic part providing an elastic force maintaining close attachment of the contact to the stator, wherein
the piezoelectric body is a multilayer ceramic structure in which first, second and third ceramic sheets are stacked perpendicularly to the flat portion,
the first internal piezoelectric body includes a first internal electrode provided on the first ceramic sheet by pattern printing and electrically connected to a first external electrode provided on an outer surface of the piezoelectric body, and the second internal piezoelectric body includes a second internal electrode provided on the second ceramic sheet by pattern printing and electrically connected to a second external electrode provided on the outer surface of the piezoelectric body, wherein the first internal piezoelectric body and the second internal piezoelectric body are polarized in a direction of a thickness of the piezoelectric body, and
an internal ground electrode is provided on the third ceramic sheet by pattern printing and is electrically connected to an external ground electrode provided on the outer surface of the piezoelectric body.

4. The piezo ultrasonic motor of claim 3, wherein the piezoelectric body is shorter in length than the elastic body.

* * * * *